United States Patent
Hoefler

(10) Patent No.: US 7,289,352 B2
(45) Date of Patent: Oct. 30, 2007

(54) SEMICONDUCTOR STORAGE DEVICE

(75) Inventor: Alexander B. Hoefler, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 105 days.

(21) Appl. No.: 11/372,495

(22) Filed: Mar. 10, 2006

(65) Prior Publication Data

US 2007/0211516 A1    Sep. 13, 2007

(51) Int. Cl.
*G11C 11/24* (2006.01)

(52) U.S. Cl. .................. 365/149; 365/104; 365/185.08

(58) Field of Classification Search ................ 365/149, 365/104, 185.08, 52, 129, 63
See application file for complete search history.

(56) References Cited

U.S. PATENT DOCUMENTS

| | | | |
|---|---|---|---|
| 5,892,709 A | 4/1999 | Parris et al. | |
| 6,414,872 B1 | 7/2002 | Bergemont et al. | |
| 6,836,425 B2 * | 12/2004 | Kang et al. ................. | 365/145 |
| 2004/0021166 A1 | 2/2004 | Hyde et al. | |
| 2004/0129985 A1 | 7/2004 | Lee et al. | |

OTHER PUBLICATIONS

Lee, Kung-Hong; "New Single-poly EEPROM with Cell size down to 8F$^2$ for Gigh Density Embedded Nonvolatile Memory Applications"; 2003; pp. 93-94; 2003 Symposium of VLSI Technology digest of Technical Papers; USA.
U.S. Appl. No. 11/068,625, filed Feb. 28, 2005.

* cited by examiner

*Primary Examiner*—Richard T. Elms
*Assistant Examiner*—Dang Nguyen
(74) *Attorney, Agent, or Firm*—Robert L. King; James L. Clingan, Jr.

(57) ABSTRACT

A semiconductor storage device floats the gate of a conventional transistor between two capacitors to store a logic state which can be utilized to store the condition of a circuit such as a latching type circuit such as a flip-flop or register prior to a power down operation to save power. The gate and first terminals of the two capacitors preferably share the same conductive line such as a polysilicon segment. A second transistor and a second set of capacitors store the complementary state of the logic state so that complementary signals are provided for detecting the stored logic state. After the time for power down has ended, the state of the semiconductor storage device made up of the two transistors and four capacitors is sensed, and the detected logic state is loaded back into the latching type circuit.

15 Claims, 1 Drawing Sheet

SEMICONDUCTOR STORAGE DEVICE

FIELD OF THE INVENTION

This invention relates generally to semiconductors, and more specifically, to semiconductor devices having information storage capability.

BACKGROUND OF THE INVENTION

Storage devices are used in the vast majority of semiconductor integrated circuits. In many of these integrated circuits a need exists for the storage devices to be non-volatile meaning that stored data remains even when electrical power is removed from the integrated circuit. Typically, non-volatile storage devices require additional processing complexity to form non-volatile storage devices. For example, multiple layers of material such as polysilicon are required to implement a floating gate transistor which is a common transistor used to implement a nonvolatile storage device. Additionally, the programming and erasing of these devices is complex wherein multiple voltages at possibly different polarities are required. Another characteristic of many non-volatile storage devices is an undesirably large power consumption which is required to store the data in a non-volatile element. Further, a complex reference circuit is required to reliably sense the state of a non-volatile storage device. These characteristics of existing non-volatile storage devices create circuits which are either complex and therefore more costly to manufacture, which have significant power consumption, and/or which require significant circuit area.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
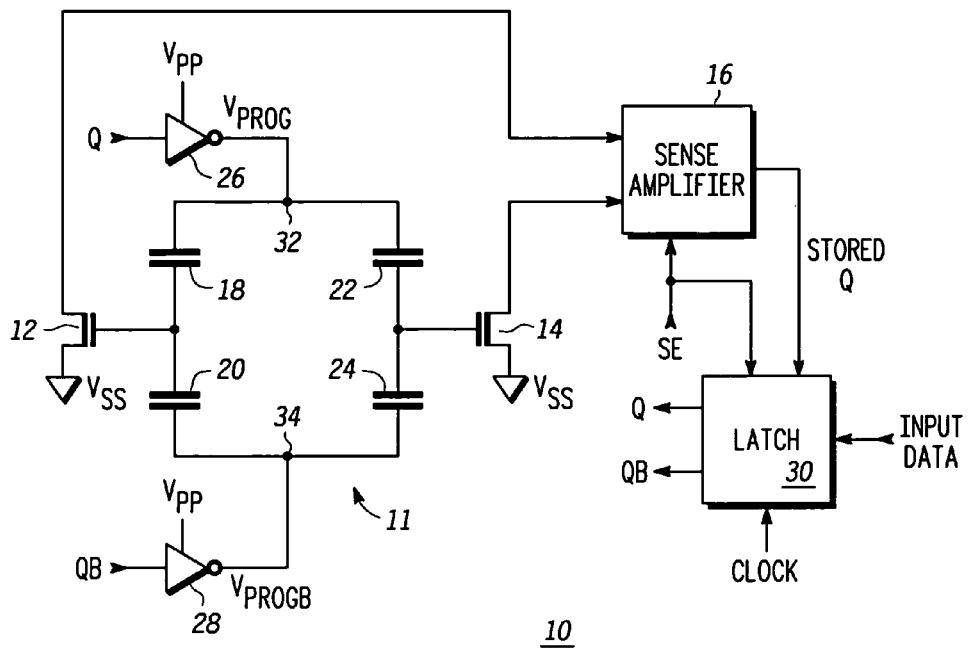
FIG. 1 illustrates in schematic form a non-volatile latch in accordance with the present invention.

Illustrated in FIG. 1 is a schematic of a nonvolatile latch 10. The nonvolatile latch 10 has a storage cell 11 and is coupled to a sense amplifier 16 and a latch 30. The latch 30 is a conventional flip-flop and has a data input for receiving input data, a clock input for receiving a clock signal, and complementary data outputs for providing complementary signals Q and QB (Q Bar). The latch 30 has a sense enable input for receiving a sense enable signal, SE and a control input for receiving a signal labeled "Stored Q".

The storage cell 11 has a transistor 12, a transistor 14 and capacitors 18, 20, 22 and 24. Each of transistor 12 and transistor 14 is an N-channel MOS (metal oxide semiconductor) transistor. Capacitor 18 has a first electrode connected to a node 32. A level shifting circuit 26 has an input for receiving the signal Q from latch 30. An output of level shifting circuit 26 is connected to node 32 and provides a program voltage labeled $V_{PROG}$ which has a voltage magnitude that is shifted or increased from the input voltage of Q. A second electrode of capacitor 18 is connected to a gate of transistor 12 that is actually at a floating potential as will be discussed below. A first electrode of capacitor 20 is connected to a node 34. A level shifting circuit 28 has an input for receiving the complementary signal QB from latch 30. An output of level shifting circuit 28 is connected to node 34 and provides a complementary program voltage labeled $V_{PROGB}$ which has a voltage magnitude that is shifted or increased from the input voltage of QB. A second electrode of capacitor 20 is connected to the gate of transistor 12. A first electrode of a capacitor 22 is connected to node 32. A second electrode of capacitor 22 is connected to a gate of transistor 14. A first electrode of a capacitor 24 is connected to node 34. A second electrode of capacitor 24 is connected to a gate of transistor 14. Transistor 12 and transistor 14 each has a source connected to a power supply terminal for receiving a voltage labeled $V_{SS}$. Transistor 12 has a drain connected to a first sensing input of sense amplifier 16, and transistor 14 has a drain connected to a second sensing input of sense amplifier 16. As will be further illustrated in connection with FIG. 2, the second electrode of capacitor 18 is formed by a same first portion of conductive material, such as polysilicon, as the gate or control electrode of transistor 12. Similarly, the second electrode of capacitor 20 is formed by a same second portion of conductive material as the gate of transistor 12. Additionally, the second electrode of capacitor 22 is formed by a same first portion of conductive material as the gate of transistor 14. Further, the second electrode of capacitor 24 is formed by a same second portion of conductive material as the gate of transistor 14.

In a program operation, input data is latched into the latch 30 under control of the Clock signal. When the Clock signal transitions to a high logic state, the Q output of latch 30 becomes the same value as what is presently at the input for the Input Data. The complementary signals Q and QB are level shifted and coupled to nodes 32 and 34, respectively. As will be described below in connection with FIG. 2, the nodes 32 and 34 are an N-conductivity well region of the semiconductor device. The capacitance of capacitor 18 is dimensioned relative to the capacitance of capacitor 20 so that capacitor 18 has significantly more capacitance than capacitor 20. Similarly, the capacitance of capacitor 22 is dimensioned relative to the capacitance of capacitor 24 so that capacitor 22 has significantly less capacitance than capacitor 24. In one form, the ratios that are used vary within a range of two-to-one to ten-to-one wherein any ratio within that range may be used, although higher ratios may be implemented. The dimensioning may be implemented by either specifying the physical area of the capacitors or by sizing the thickness of the capacitive dielectric of each capacitor, or by specifying both of these parameters.

As a result of the capacitive size ratios, when a positive program voltage $V_{PROG}$ is applied to node 32 and a smaller complementary program voltage is applied to node 34 the $V_{PROG}$ voltage will be coupled in almost its entirety to the gate of transistor 12. As a result, a high electric field will develop across capacitor 20 and lead to electron tunneling from node 34 onto the gate of transistor 12. Reciprocally, the $V_{PROGB}$ voltage will be coupled in almost its entirety to the gate of transistor 14. As a result, a high electric field will develop across capacitor 22 and lead to electron tunneling from the gate of transistor 14 to node 32. The electron tunnel mechanism is conventional Fowler-Nordheim or direct tunneling or a combination of both and will therefore not be described in any greater detail. As a result of the charge which has been established in storage cell 11, the gate of transistor 14 will predominantly be positively charged whereas the gate of transistor 12 will predominantly be negatively charged.

Conversely, when a positive program voltage $V_{PROG}$ is applied to node 32 and a larger complementary program voltage is applied to node 34 the $V_{PROG}$ voltage will be coupled in almost its entirety to the gate of transistor 12. As a result, a high electric field will develop across capacitor 20 and lead to electron tunneling to node 34 from the gate of transistor 12. Reciprocally, the $V_{PROGB}$ voltage will be coupled in almost its entirety to the gate of transistor 14. As a result, a high electric field will develop across capacitor 22 and lead to electron tunneling from node 32 to the gate of transistor 14. The electron tunnel mechanism is conventional Fowler-Nordheim or direct tunneling or a combination of both and will therefore not be described in any greater detail. As a result of the charge which has been established in storage cell 11, the gate of transistor 12 will predominantly be positively charged whereas the gate of transistor 14 will predominantly be negatively charged. It should be understood that transistors 12 and 14 operate in a complementary manner to obtain a first charge state for a first complementary relationship between Q and QB. Conversely, transistors 12 and 14 operate in a complementary manner to obtain an opposite second charge state for a second complementary relationship between Q and QB.

In a read operation, the program voltage $V_{PROG}$ and $V_{PROGB}$ are forced to a substantially identical voltage which is small in magnitude relative to $V_{PP}$. Due to the charge differential present on the gates of transistors 12 and 14, the transistors will exhibit different drain currents. For example, if the gate of transistor 12 is positively charged relative to the gate of transistor 14, transistor 12 will exhibit a higher drain current than transistor 14. Conversely, if the gate of transistor 14 is positively charged relative to the gate of transistor 12, transistor 14 will exhibit a higher drain current than transistor 12. The sense amplifier 16 will detect the difference in the drain currents of transistors 12 and 14 and amplify the difference to provide an output signal in the form of the Stored Q signal. This signal represents the previous Q output of latch 30 that was stored by storage cell 11 in the last program operation performed by storage cell 11.

It should be noted in connection with the schematic of FIG. 1, the gate of each of transistors 12 and 14 does not have a resistive path to ground and therefore is allowed to electrically float. Therefore, the gate of each of transistors 12 and 14 may be considered to be a floating gate. As will be made clear in connection with FIG. 2, portions of the same conductive material that is used for the gate of transistor 12 are shared to also function as one of the electrodes of each of capacitor 18 and capacitor 20. Additionally, an N-conductivity well is used as the remaining electrode for capacitor 18 and a second N-conductivity well is used as the remaining electrode for capacitor 20.

Figure 2:
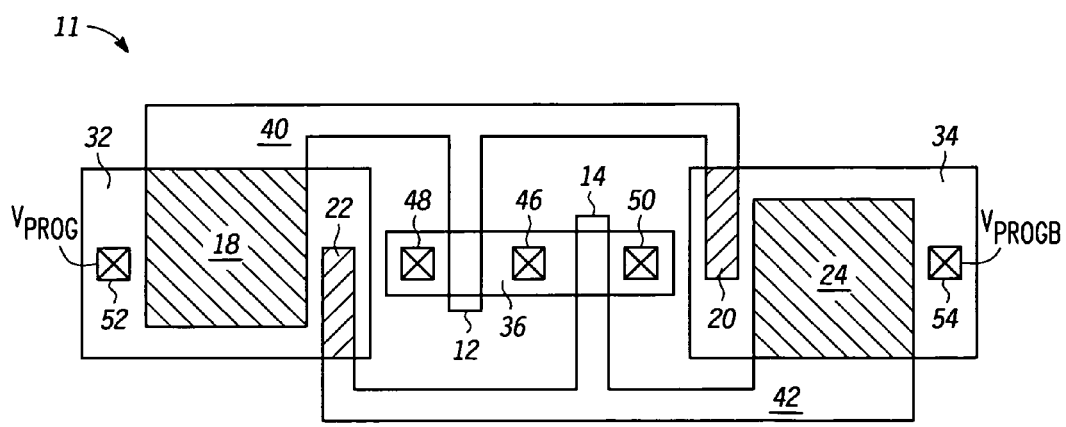
FIG. 2 illustrates in topographical form a layout of the storage cell of FIG. 1.

Illustrated in FIG. 2 is one form of a layout of the storage cell 11 of FIG. 1. Elements in common with FIG. 1 and FIG. 2 are given the same reference number for purposes of being able to correlate the two figures. Node 32 in FIG. 1 is implemented in FIG. 2 as an active well region. It should be noted that the node 32 is an active region of silicon so that electrical contact may be made and is also an N-conductivity well at the same time. The N-well or node 32 encloses the active region. Electrical contact to node 32 may be made by a contact 52 positioned on an exposed surface of node 32. Similarly, the node 34 is an active region of silicon so that electrical contact may be made and is also an N-conductivity well at the same time. The N-well or node 34 encloses the active region. Electrical contact to node 34 may be made by a contact 54 positioned on an exposed surface of node 34.

Also illustrated in FIG. 2 is an active region 36 which is formed, for example, as a rectangular area of silicon. Electrical contact to active region 36 is made via a plurality of contacts such as a contact 46, a contact 48 and a contact 50. The region 36 is termed "active" because exposed surfaces exist to the region for the purpose of making electrical contact to the region. The contact 46 functions as a source electrode contact for each of transistors 12 and 14. The potential $V_{SS}$ is connected to contact 46. Contact 48 functions as a drain electrode contact for transistor 12, and contact 50 functions as a drain electrode contact for transistor 14. Each of the contacts 48 and 50 is connected to sense amplifier 16. Overlying and overlapping a portion of the nodes 32 and 34 and active region 36 are continuous polysilicon layer 40 and continuous polysilicon layer 42. The continuous polysilicon layer 40 overlies a portion of node 32 to form the first electrode of capacitor 18 having a size that is denoted by cross-hatching from upper-left to lower-right. The continuous polysilicon layer 40 also extends over a portion of active region 36 to form the floating gate electrode of transistor 12. The continuous polysilicon layer 40 further extends and overlies a portion of the node 34 as denoted by cross-hatching from lower-left to upper-right. The portion overlapping node 34 forms the second electrode of capacitor 20. Because node 32 is an active region, electrical contact is made to node 32 by a contact 52 which provides electrical contact to the first electrode of capacitors 18 and 22.

Additionally, the continuous polysilicon layer 42 overlies a portion of node 32 to form the second electrode of capacitor 22 having a size that is denoted by cross-hatching from lower-left to upper-right. The continuous polysilicon layer 42 also extends over a portion of active region 36 to form the floating gate electrode of transistor 14. The continuous polysilicon layer 42 further extends and overlies a portion of the node 34 as denoted by cross-hatching from upper-left to lower-right. The portion overlapping node 34 forms the second electrode of capacitor 24. Electrical contact to the node 34 is made by a contact 54 which provides electrical contact to the first electrodes of capacitors 20 and 24.

It should be noted that the layout of storage cell 11 is implemented with a conventional CMOS process and no additional specialized processing. For example, numerous nonvolatile storage cells require specialized process steps and structures so that a conventional MOS manufacturing flow must be supplemented or modified. As illustrated in FIG. 2 the node 32 and the node 34 are overlapped by two monolithic areas of polysilicon, or other conductive material, in such a way that the overlap area of one polysilicon area is small over one node but large over the other node. When one of nodes 32 and 34 is biased, a high electric field develops across capacitors 20 and 22 which results in a tunneling current to boost the electrical potential of the gate of one of the transistors. The direction of tunneling current is determined by the relative amount of capacitive coupling between each gate and the nodes 32 and 34. As described above, the biasing provided by $V_{PROG}$ and $V_{PROGB}$ causes the charging of one gate of transistors 12 and 14 and the discharging of the other through Fowler-Nordheim or direct tunneling. As illustrated in FIG. 2 a monolithic floating gate is formed with a same material that is used to form a connected electrode of each of two adjacent capacitors. As a result of the gate of transistor 12 and transistor 14 being capacitively coupled and not grounded, the gates of each of transistors 12 and 14 is electrically floating. Charging of transistor 12 and discharging of transistor 14, or the inverse operation, depending on the state of Q and QB, can also be achieved by applying a short voltage pulse to the $V_{PP}$ supply, instead of a continuous $V_{PP}$ signal. This pulse typically can have a duration of from approximately ten nanoseconds to several hundred milliseconds. When the power is removed, the charge on the gates of transistors 12 and 14 remains for a significant amount of time and therefore the storage cell 11 is nonvolatile. When power is subsequently restored, adequate charge is present to continue operation in a manner as if no interruption in the source of power occurred. Specifically, after restoring power, a sense operation can be performed that will provide an output, "STORED Q", at the output of sense amplifier 16. This value can subsequently be stored back to latch 30. After this operation, the latch 30 will be in the same state as it was when the power was shut down.

As illustrated in FIG. 1, the dielectrics which separate the electrodes of capacitors 18, 20, 22 and 24 are the same thickness. In one form the dielectrics are sized to have a value that is within a range of fifteen Angstroms to one hundred Angstroms. In one form the dielectric thickness of capacitor 18 and capacitor 24 are the same and have a first thickness. In this form the dielectric thickness of capacitor 22 and capacitor 20 are the same and have a second thickness. The first thickness may or may not be the same as the second thickness. In this manner, the layout of FIG. 2 exhibits structural balance which results in symmetry of charge.

By now it should be appreciated that there has been provided a nonvolatile storage cell for use in a standard MOS process. The layout of the storage cell 11 is symmetrical. In one form there is provided a semiconductor storage device in which a first transistor has a gate. A source is coupled to a first power supply terminal and a drain as a first output of the semiconductor storage device. A first capacitor has a first terminal coupled to the gate of the first transistor, a second terminal coupled to a first programming terminal, and a first capacitance. A second capacitor has a first terminal coupled to the gate of the first transistor, a second terminal coupled to a second programming terminal, and a second capacitance, wherein the first capacitance is greater than the second capacitance. A second transistor has a gate, a source coupled to the first power supply terminal and coupled to the source of the first transistor. A drain is a second output of the semiconductor storage device. A third capacitor has a first terminal coupled to the gate of the second transistor, a second terminal coupled to the first programming terminal, and a third capacitance. A fourth capacitor has a first terminal coupled to the gate of the second transistor, a second terminal coupled to the second programming terminal, and a fourth capacitance, wherein the fourth capacitance is greater than the third capacitance. In another form the first capacitance is at least two times greater than the second capacitance. In another form the first capacitance is at least five times greater than the second capacitance. In yet another form the gate of the first transistor, the first terminal of the first capacitor, and the first terminal of the second capacitor are portions of a first continuous conductive line. In yet another form the first continuous conductive line comprises a first continuous polysilicon segment. In another form the sources and drains of the first and second transistors are in a first active region and the second terminals of the first and the third capacitors are in a second active region. Additionally, the second terminals of the second and the fourth capacitors are in a third active region. In yet another form the first terminals of the first and the third capacitors are over the second active region. The first terminals of the second and the fourth capacitors are over the third active region. In another form the gate of the first transistor, the first terminal of the first capacitor, and the first terminal of the second capacitor are portions of a first continuous polysilicon segment. In another form the first terminal of the first capacitor is separated from the second active region by a first dielectric layer having a first thickness, and the first terminal of the fourth capacitor is separated from the third active region by a second dielectric layer having the first thickness. In yet another form the first programming terminal is for being at a higher voltage than the second programming terminal to establish a first logic state of the semiconductor storage device. The second programming terminal is for being at a higher voltage than the first programming terminal to establish a second logic state of the semiconductor storage device.

In another form a semiconductor storage device has a first transistor having a gate, a source coupled to a first power supply terminal, and a drain. A first capacitor has a first terminal coupled to the gate of the first transistor, a second terminal coupled to a first programming terminal, and a first capacitance. A second capacitor has a first terminal coupled to the gate of the first transistor, a second terminal coupled to a second programming terminal, and a second capacitance. The first capacitance is greater than the second capacitance. A second transistor has a gate, a source coupled to the first power supply terminal and coupled to the source of the first transistor, and a drain. A third capacitor has a first terminal coupled to the gate of the second transistor, a second terminal coupled to the first programming terminal, and a third capacitance. A fourth capacitor has a first terminal coupled to the gate of the second transistor, a second terminal coupled to the second programming terminal, and a fourth capacitance. the fourth capacitance is greater than the third capacitance. A sense amplifier has a first input coupled to the drain of the first transistor, a second input coupled to the drain of the second transistor, and an output. A latch has a first input for receiving a data signal, a second input coupled to the output of the sense amplifier, and an output. A coupling device is responsive to the output of the latch that selectively couples a programming voltage to one of the first and second programming terminals. In another form the latch is further characterized as responsive to a sense enable signal. The sense amplifier is further characterized as responsive to the sense enable signal. In another form the output of the latch provides a true signal and a complementary signal. In one form the coupling device is a first coupler responsive to the true signal and a second coupler responsive to the complementary signal. In another form the first capacitance is at least five times greater than the second capacitance. The gate of the first transistor, the first terminal of the first capacitor, and the first terminal of the second capacitor are portions of a first continuous polysilicon segment. In yet another form the sources and drains of the first and second transistors are in a first active region. The second terminals of the first and the third capacitors are in a second active region. The second terminals of the second and the fourth capacitors are in a third active region. The first terminals of the first and the third capacitors are over the second active region, and the first terminals of the second and the fourth capacitors are over the third active region.

In yet another form a semiconductor storage device has a first transistor having a gate comprised of a first polysilicon segment over a first active region, a source formed in the first active region, and a drain formed in the first active region. A first capacitor has a first terminal formed of the first polysilicon segment over a second active region, a second terminal in the second active region, and a first capacitance. A second capacitor has a first terminal formed of the first polysilicon segment over a third active region, a second terminal in the third active region, and a second capacitance, wherein the first capacitance is greater than the second capacitance. A second transistor has a gate formed of a second polysilicon segment over the first active region, a source formed in the first active region and coupled to the source of the first transistor, and a drain formed in the first active region. A third capacitor has a first terminal formed of the second polysilicon segment over the second active region, a second terminal in the second active region, and a third capacitance. A fourth capacitor has a first terminal formed of the second polysilicon segment over the third active region, a second terminal in the third active region, and a fourth capacitance, wherein the fourth capacitance is greater than the third capacitance. In another form the first capacitance is at least two times greater than the second capacitance. In yet another form the first capacitance is at least five times greater than the second capacitance. The second active region and the third active region are further characterized as well regions. In yet another form the first terminal of the first capacitor is separated from the second active region by a first dielectric layer having a first thickness. The first terminal of the fourth capacitor is separated from the third active region by a second dielectric layer having the first thickness. In another form the first terminal of the second capacitor is separated from the second active region by a first dielectric layer having a first thickness. The first terminal of the third capacitor is separated from the third active region by a second dielectric layer having the first thickness.

In the foregoing specification, the invention has been described with reference to specific embodiments. However, one of ordinary skill in the art appreciates that various modifications and changes can be made without departing from the scope of the present invention as set forth in the claims below. For example, the polysilicon layer 40 and polysilicon layer 42 may be implemented with conductive materials other than polysilicon. A conductive material such as any of numerous metals or metal alloys used in semiconductor manufacturing may be used. The nonvolatile storage cell 11 described herein may be used with circuitry other than sense amplifier 16 and latch 30. While a differential bitcell is herein described, it should be understood that an alternate embodiment that does not utilize a differential output may be implemented wherein a single transistor and two capacitors are used to store data and that data is sensed using a reference signal.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A semiconductor storage device, comprising:
   a first transistor having a gate, a source coupled to a first power supply terminal, and a drain as a first output of the semiconductor storage device;
   a first capacitor having a first terminal coupled to the gate of the first transistor, a second terminal coupled to a first programming terminal, and a first capacitance;
   a second capacitor having a first terminal coupled to the gate of the first transistor, a second terminal coupled to a second programming terminal, and a second capacitance, wherein the first capacitance is greater than the second capacitance;
   a second transistor having a gate, a source coupled to the first power supply terminal and coupled to the source of the first transistor, and a drain as a second output of the semiconductor storage device;
   a third capacitor having a first terminal coupled to the gate of the second transistor, a second terminal coupled to the first programming terminal, and a third capacitance;
   a fourth capacitor having a first terminal coupled to the gate of the second transistor, a second terminal coupled to the second programming terminal, and a fourth capacitance, wherein the fourth capacitance is greater than the third capacitance.

2. The semiconductor storage device of claim 1, wherein the first capacitance is at least two times greater than the second capacitance.

3. The semiconductor storage device of claim 1, wherein the first capacitance is at least five times greater than the second capacitance.

4. The semiconductor storage device of claim 1, wherein the gate of the first transistor, the first terminal of the first capacitor, and the first terminal of the second capacitor comprise portions of a first continuous conductive line.

5. The semiconductor storage device of claim 4, wherein the first continuous conductive line comprises a first continuous polysilicon segment.

6. The semiconductor storage device of claim 1, wherein:
   the sources and drains of the first and second transistors are in a first active region;
   the second terminals of the first and the third capacitors are in a second active region; and
   the second terminals of the second and the fourth capacitors are in a third active region.

7. The semiconductor storage device of claim 6, wherein:
   the first terminals of the first and the third capacitors are over the second active region; and
   the first terminals of the second and the fourth capacitors are over the third active region.

8. The semiconductor storage device of claim 7, wherein the gate of the first transistor, the first terminal of the first capacitor, and the first terminal of the second capacitor comprise portions of a first continuous polysilicon segment.

9. The semiconductor storage device of claim 8, wherein:
the first terminal of the first capacitor is separated from the second active region by a first dielectric layer having a first thickness; and
the first terminal of the fourth capacitor is separated from the third active region by a second dielectric layer having the first thickness.

10. The semiconductor storage device of claim 1, wherein:
the first programming terminal is for being at a higher voltage than the second programming terminal to establish a first logic state of the semiconductor storage device; and
the second programming terminal is for being at a higher voltage than the first programming terminal to establish a second logic state of the semiconductor storage device.

11. A semiconductor storage device, comprising:
a first transistor having a gate, a source coupled to a first power supply terminal, and a drain;
a first capacitor having a first terminal coupled to the gate of the first transistor, a second terminal coupled to a first programming terminal, and a first capacitance;
a second capacitor having a first terminal coupled to the gate of the first transistor, a second terminal coupled to a second programming terminal, and a second capacitance, wherein the first capacitance is greater than the second capacitance;
a second transistor having a gate, a source coupled to the first power supply terminal and coupled to the source of the first transistor, and a drain;
a third capacitor having a first terminal coupled to the gate of the second transistor, a second terminal coupled to the first programming terminal, and a third capacitance;
a fourth capacitor having a first terminal coupled to the gate of the second transistor, a second terminal coupled to the second programming terminal, and a fourth capacitance, wherein the fourth capacitance is greater than the third capacitance;
a sense amplifier having a first input coupled to the drain of the first transistor, a second input coupled to the drain of the second transistor, and an output;
a latch having a first input for receiving a data signal, a second input coupled to the output of the sense amplifier, and an output; and
a coupling device, responsive to the output of the latch that selectively couples a programming voltage to one of the first and second programming terminals.

12. The semiconductor storage device of claim 11, wherein:
the latch is further characterized as responsive to a sense enable signal; and
the sense amplifier is further characterized as responsive to the sense enable signal.

13. The semiconductor storage device of claim 12, wherein:
the output of the latch provides a true signal and a complementary signal; and
the coupling device comprises a first coupler responsive to the true signal and a second coupler responsive to the complementary signal.

14. The semiconductor storage device of claim 11, wherein:
the first capacitance is at least five times greater than the second capacitance; and
the gate of the first transistor, the first terminal of the first capacitor, and the first terminal of the second capacitor comprise portions of a first continuous polysilicon segment.

15. The semiconductor storage device of claim 14, wherein:
the sources and drains of the first and second transistors are in a first active region;
the second terminals of the first and the third capacitors are in a second active region;
the second terminals of the second and the fourth capacitors are in a third active region;
the first terminals of the first and the third capacitors are over the second active region; and
the first terminals of the second and the fourth capacitors are over the third active region.

* * * * *